United States Patent [19]

Yoshida et al.

[11] Patent Number: 5,615,735

[45] Date of Patent: Apr. 1, 1997

[54] HEAT SINK SPRING CLAMP

[75] Inventors: Stuart Yoshida; Rex Seader; Stephen P. Neisen, all of Fort Collins, Colo.

[73] Assignee: Hewlett-Packard Co., Palo Alto, Calif.

[21] Appl. No.: 315,036

[22] Filed: Sep. 29, 1994

[51] Int. Cl.⁶ ........................................................ F28F 7/00
[52] U.S. Cl. ............................ 165/80.3; 257/722; 257/719; 361/709
[58] Field of Search .................................. 257/727, 726, 257/719, 718; 165/80.3, 80.2, 67; 361/707, 709, 710, 690, 697, 711

[56] References Cited

U.S. PATENT DOCUMENTS

| | | | |
|---|---|---|---|
| 3,038,703 | 6/1962 | Deakin | 257/718 X |
| 4,679,118 | 7/1987 | Johnson et al. | 361/710 X |
| 4,745,456 | 5/1988 | Clemens | 165/80.2 X |
| 5,052,474 | 10/1991 | Bronnert | 165/67 |
| 5,168,926 | 12/1992 | Watson et al. | 165/185 |
| 5,208,731 | 5/1993 | Blomquist | 257/718 X |
| 5,280,409 | 1/1994 | Selna et al. | 257/718 X |
| 5,287,249 | 2/1994 | Chen | 257/719 X |
| 5,307,239 | 4/1994 | McCarty et al. | 257/719 X |
| 5,323,845 | 6/1994 | Kin-Shon | 165/80.3 |
| 5,357,404 | 10/1994 | Bright et al. | 257/718 X |
| 5,381,305 | 1/1995 | Harmon et al. | 257/719 X |
| 5,386,338 | 1/1995 | Jordan et al. | 165/80.3 X |
| 5,396,402 | 3/1995 | Perugini et al. | 257/719 X |
| 5,423,375 | 6/1995 | Chiou | 257/719 X |
| 5,486,981 | 1/1996 | Blomquist | 361/710 X |

FOREIGN PATENT DOCUMENTS

| | | | |
|---|---|---|---|
| 4226816 | 2/1994 | Germany | 257/718 |
| 2-119250 | 5/1990 | Japan | 257/718 |
| 5-191071 | 7/1993 | Japan | 361/710 |

OTHER PUBLICATIONS

Thermalloy, Inc., "New Heat Sink Spring Clip For Use With AMP* Low Insertion Force PGA Sockets," Apr., 1993, *AMP is a Trademark of AMP Incorporated.

EG&G Wakefield Engineering, "669 Series SpiderClip™ Heat Sink And Clip Assembly For Intel 80486DX And 80486DX2™ Microprocessors," Bulletin 1204, Sep. 1992, Four pages.

*Primary Examiner*—John Rivell
*Assistant Examiner*—Christopher Atkinson
*Attorney, Agent, or Firm*—Cynthia S. Baan

[57] ABSTRACT

An improved heat sink assembly apparatus and method of attachment that includes a heat sink with extruded fins, an integrated circuit package, a printed circuit board and a clamp. The printed circuit board is manufactured with L-shaped holes that correspond to opposing corners of the integrated circuit package and the distance between two notched feet on the clamp. To assemble, the integrated circuit package is mounted to the printed circuit board, the heat sink is mounted to a top surface of the integrated circuit package, the clamp is mounted between extruded fins on the heat sink, and then the feet of the clamp are locked into the L-shaped holes on the printed circuit board.

6 Claims, 6 Drawing Sheets

HEAT SINK SPRING CLAMP

FIELD OF THE INVENTION

The present invention relates generally to the field of integrated circuit heat dissipation and more particularly to integrated circuit heat sinks. In particular, this invention provides an improved method for attaching a heat sink to an integrated circuit package.

BACKGROUND OF THE INVENTION

Typically heat sinks are mounted to an outer surface of an integrated circuit (I.C.) package to facilitate the dissipation of heat from the integrated circuit contained within the package. Most heat sinks are thermally conductive and have a plurality of extruded fins to provide a large surface area, which allows heat to be more efficiently dissipated by natural or forced convection. Heat sinks are mounted to I.C. packages in variety of ways.

A heat sink may be attached to an I.C. package with a sheet of thermally conductive adhesive film, thermal epoxies, or pre-formed thermal activated epoxy pads which are placed between the flat surface of the package and the heat sink. The adhesive film is then heated while the package and heat sink are pressed together, thereby bonding the package and the heat sink together. Such a solution is characterized by reduced thermal conductivity and migration of the adhesive film over time. Also, different thermal expansion ratios of the heat sink and the package cause mechanical stress on the package. This stress in combination with the curing and hardening required to form the bond leads to decreased mechanical stability of the I.C. package and heat sink assembly. Thus, the heat sink may become loose over time or under shock or vibration. Another drawback to this method of mounting a heat sink to an I.C. package is that the heat sink must be scrapped with the I.C. when the I.C. is bad or otherwise needs to be replaced.

Another heat sink attachment method is to add a stud to the heat spreader on the I.C. package and to screw the heat sink to the package using a nut and washer or other fastening hardware. This method requires a threaded hole in the heat sink and creates a large compression force between the mating surfaces. This assembly torque procedure results in high stresses to both ceramic and plastic packages. This is also generally considered one of the most expensive methods of attachment due to the secondary operations required to manufacture both the heat spreader and the heat sink to accommodate the stud and threaded hole. This assembly process also requires greater quality control to prevent and catch cracked packages during assembly.

There are also a variety of methods known to attach heat sinks to packages by means of spring clamps. These spring clamps generally require a specially designed clamp to be made for each size package, since the clamps are clamped to the package. Also, they either require a specially designed plastic frame to clamp to under the package, which adds to the overall height and weight of the final assembly, or alternatively, they require a special tool for assembly and disassembly which adds to the cost of manufacturing and increases the difficulty of servicing the electronic component.

Accordingly, there is a need in the art of heat sink attachment for an apparatus and method of attachment that is relatively easy to assemble and disassemble, inexpensive, generally generic with regards to package compatibility, and a low profile solution to heat sink attachment.

SUMMARY OF THE INVENTION

The present invention provides a simplified heat sink attachment process, wherein fewer components and manufacturing assembly steps and no special tools are required. The present invention provides a self-correcting placement for a heat sink on an electronic component. The present invention provides a heat sink assembly that allows for large mechanical manufacturing tolerances and misalignment in the heat sink system by a self-correcting heat sink placement with little or no operator alignment required. The present invention provides a heat sink assembly that allows for the easy addition of thermal interface materials (such as thermal grease or graphite material) between the heat sink and the electronic component being cooled. The present invention provides a heat sink assembly whereby the heat sink does not have to be scrapped with the electronic component. The present invention provides a heat sink assembly whereby the footprint of the heat sink does not have to conform to the footprint of the electronic component being cooled (i.e. the heat sink can be larger or smaller than the electronic component being cooled).

The present invention is an improved heat sink assembly apparatus and method of attachment that includes a heat sink with extruded fins, an integrated circuit package, a printed circuit board and a clamp. The printed circuit board is manufactured with L-shaped holes that correspond to notched feet on the clamp. To assemble, the integrated circuit package is mounted to the printed circuit board, the heat sink is mounted to a top surface of the integrated circuit package, the clamp is mounted between extruded fins on the heat sink, and then the feet of the clamp are locked into the L-shaped holes on the printed circuit board.

DETAILED DESCRIPTION OF THE PREFERRED EMBODIMENT

Figure 1:
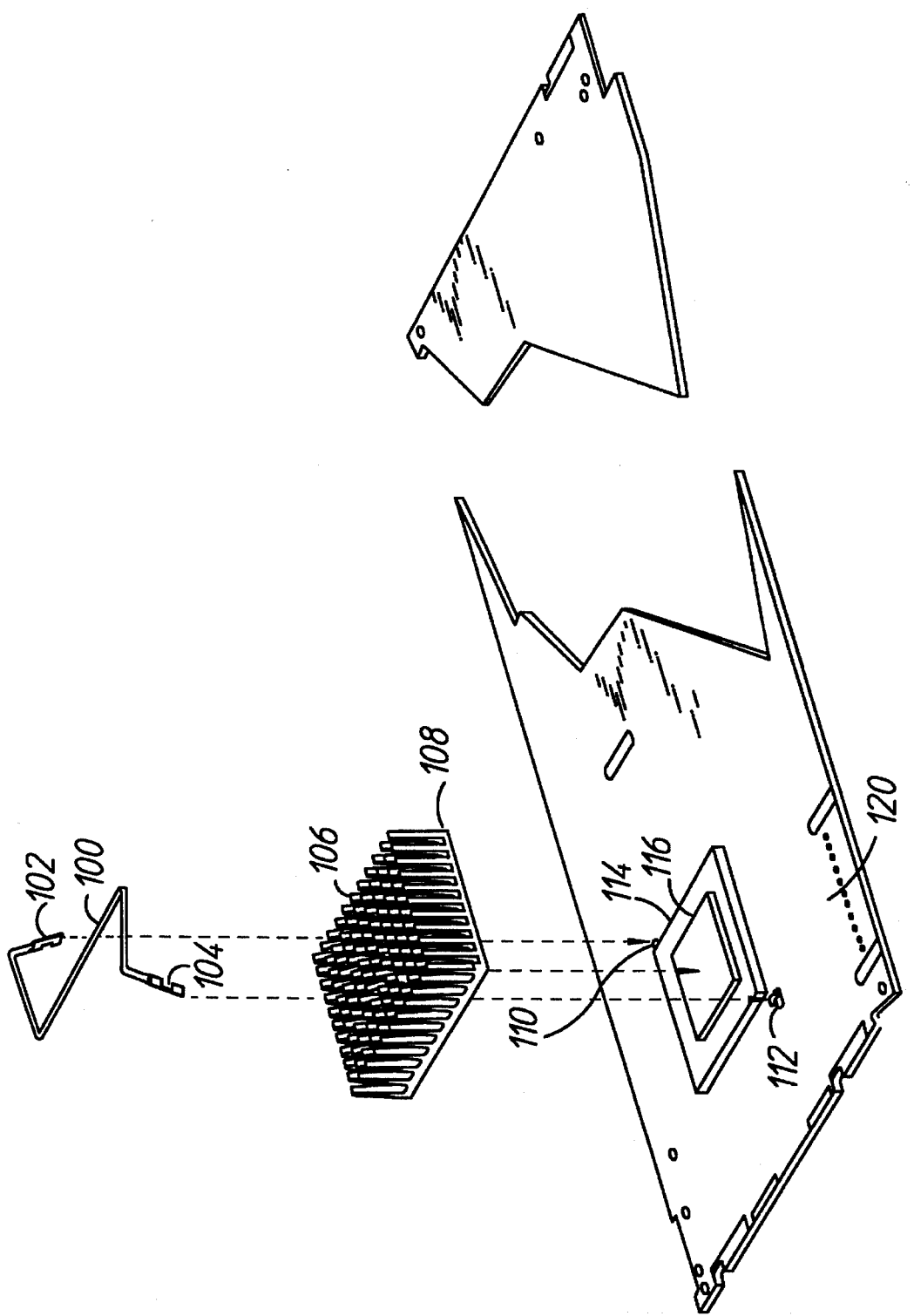
FIG. 1 shows a top perspective view of a heat sink assembly according to the present invention.

FIG. 1 shows a top perspective view of a heat sink assembly according to the present invention, which comprises an integrated circuit (I.C.) package 114 that is mounted on printed circuit board 120. Integrated circuit package 114 has a heat spreader 116 mounted thereon. Heat sink 108 which has extruded fins 106 is then mounted on top of the I.C. package 114 or preferably the heat spreader 116. After the heat sink 108 is placed on top of the I.C. package, a clamp 100 with notched feet 102 and 104 is inserted into a groove between fins 106 of heat sink 108 and clamped to printed circuit board 120 by inserted notched feet 102 and 104 into L-shaped holes 110 and 112 in printed circuit (P.C.) board 120. Notched feet 102 and 104 of clamp 100 locked to the edge of P.C. board 120 inside of holes 110 and 112.

Printed circuit board 120 can be any known printed circuit board material. L-shaped holes 110 and 112 are formed in P.C. board 120 during manufacturing when other mounting holes and features are formed in the P.C. board 120. Holes 110 and 112 are preferably located just outside opposing corners of the I.C. package's 114 final position. I.C. package 114 can be any size, shape or material I.C. package. Heat spreader 116 can be any good thermal conductive material, such as copper. Although heat spreader 116 is not necessary, it is a preferred method of heat dissipation. Heat sink 108 can be any known heat spreader that has fins. The material chosen for heat sink 108, the size of the heat sink 108, and the type of fins 106 will be selected based on heat dissipation requirements. However, heat sinks are generally aluminum or some like material. Whether the fins 106 are extruded in two directions is based on the surface area need for optimal heat dissipation requirements. However, fins 106 should be extruded with at least one groove in order to permit clamp 100 to be inserted and clamped to P.C. board 120. Heat sink clamp 100 can be made of any elastic spring material, such as hardened spring steel wire. In a preferred mode, clamp 100 is made of 302 stainless steel wire.

Figure 2:
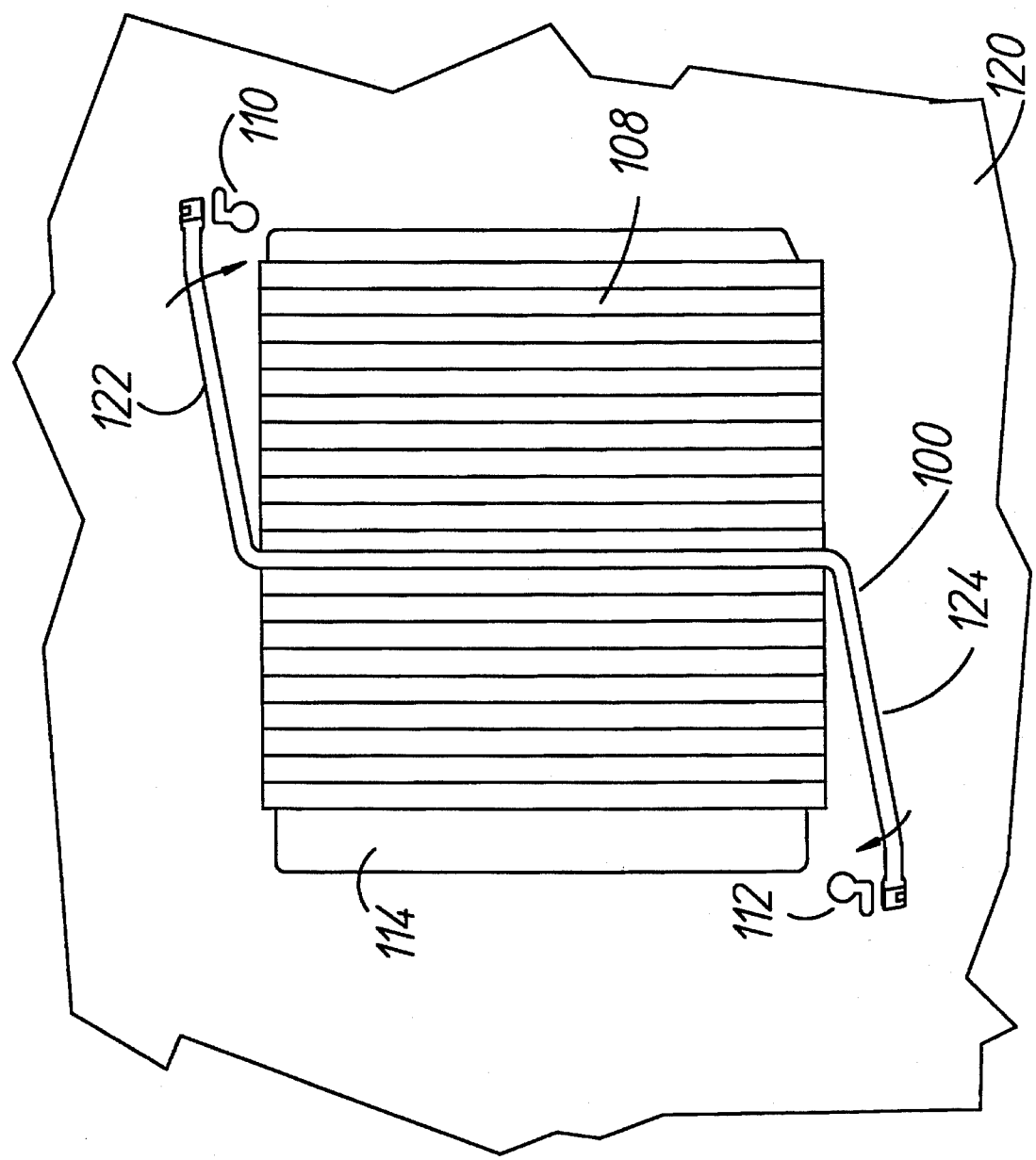
FIG. 2 shows a top view of the heat sink assembly according to the present invention.
Figure 3:
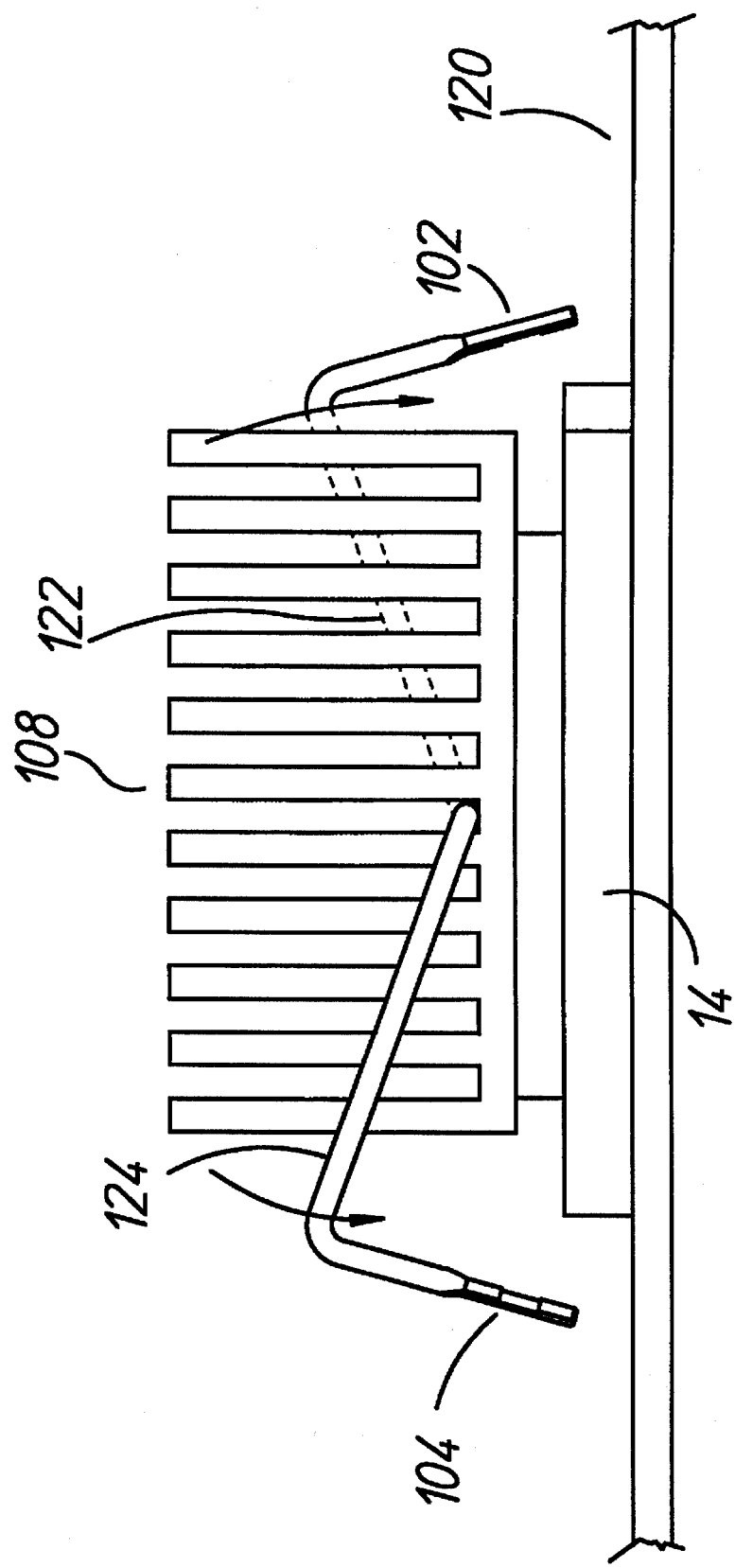
FIG. 3 shows a side view of the heat sink assembly according to the present invention.
Figure 4:
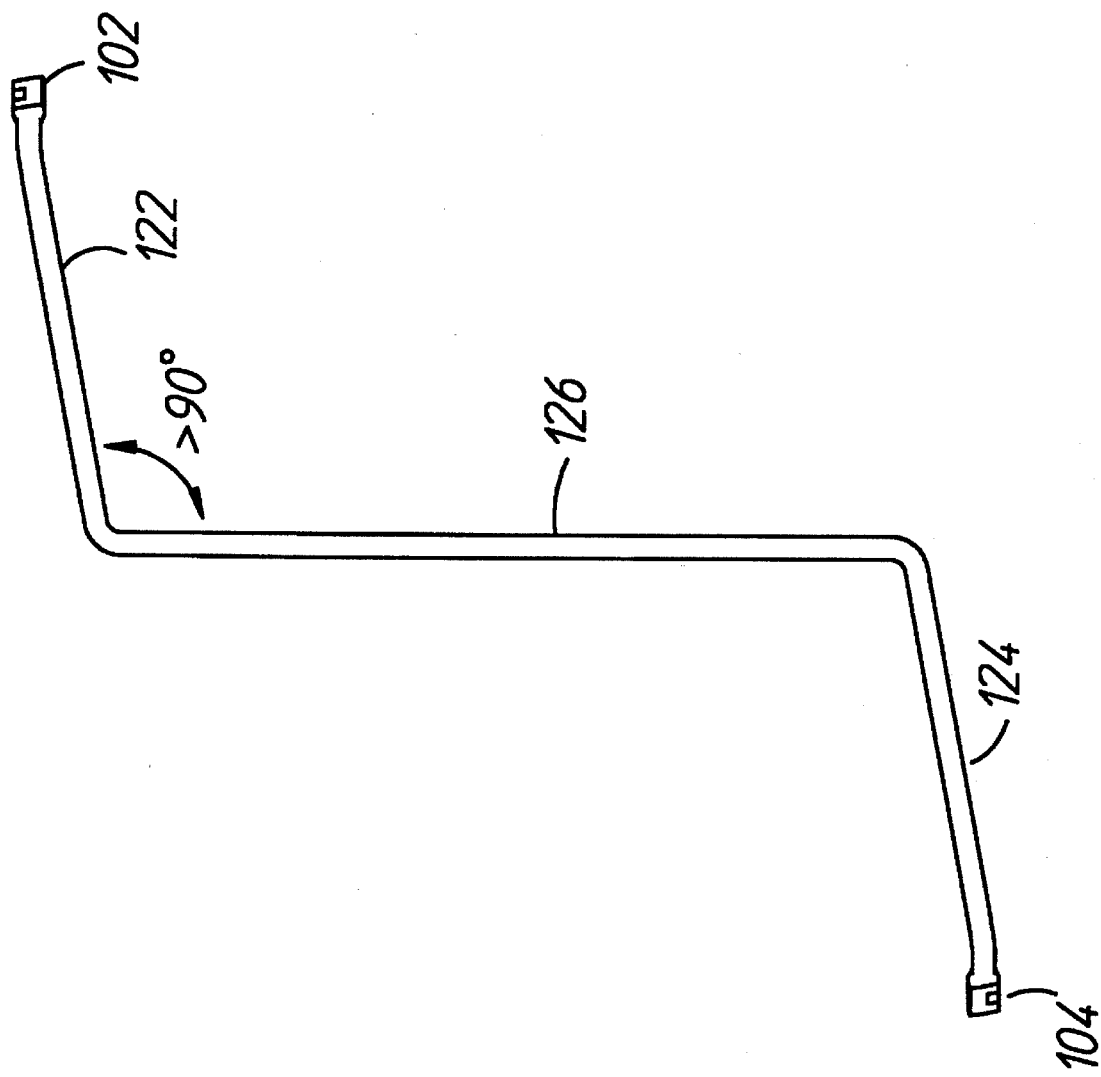
FIG. 4 shows a top view of a heat sink mounting clamp according to the present invention.
Figure 5:
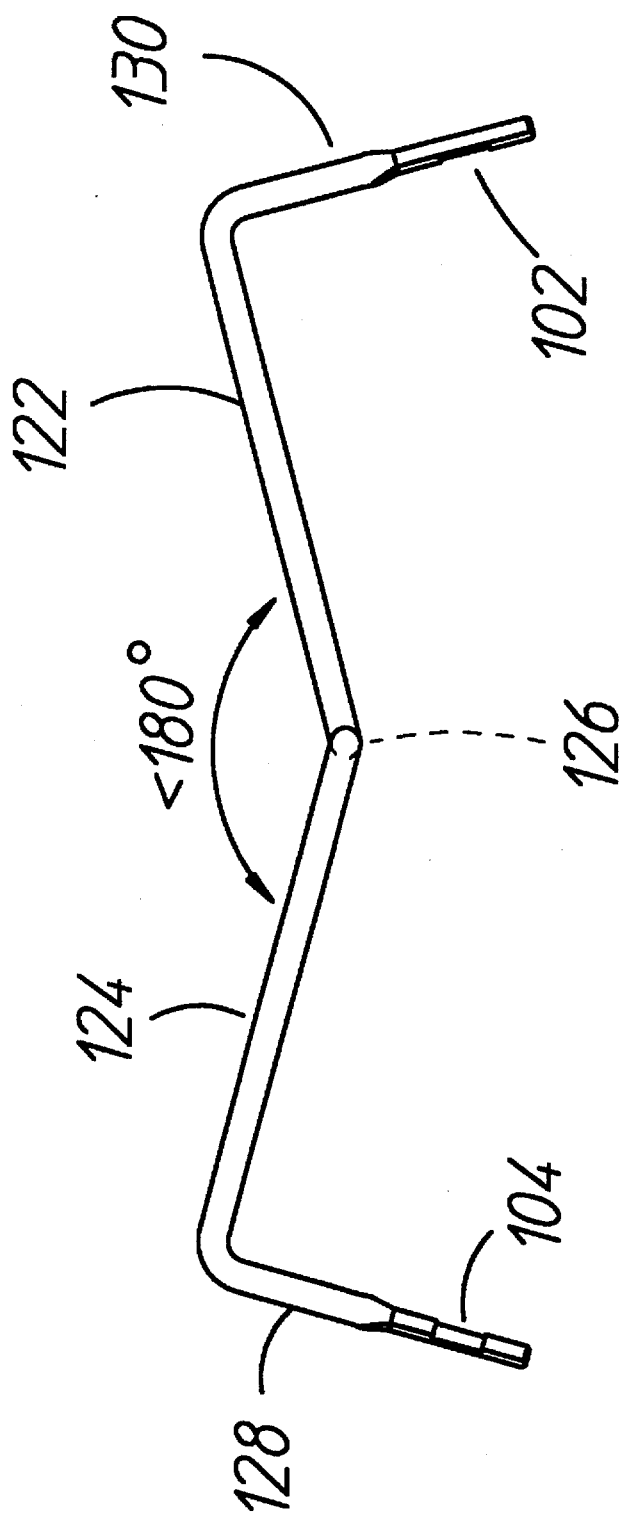
FIG. 5 shows an end view of the heat sink mounting clamp according to the present invention.

FIGS. 2 and 4 show a top view of heat sink mounting clamp 100 whereby heat sink mounting clamp 100 forms a Z-shaped pattern. Legs 122 and 124 are bent slightly past 90 degrees from central beam 126 such that legs 122 and 124 are bent slightly in the direction of notched feet 102 and 104, respectively. This Z shape creates a load such that when legs 122 and 124 are bent inward and released once notched feet 102 and 104 are inside holes 110 and 112 (see FIG. 2), notched feet 102 and 104 lock to an outer edge of holes 110 and 112 in P.C. board 120. FIGS. 3 and 5 show an end view of heat sink mounting clamp 100 whereby heat sink mounting clamp 100 forms an M-shaped pattern. In this direction, legs 122 and 124 are bent a few degrees less than 180 degrees. This M-shape creates a load such that when legs 122 and 124 are bent downward and notched feet 102 and 104 are locked in holes 110 and 112 (see FIG. 3), heat sink 108 is held securing in place on top of I.C. package 114. Thus, the Z-M shaped clamp 100 acts as a torsional spring in both the vertical and horizontal directions. Accordingly, clamp 100 holds the heat sink 108 in place on the surface of I.C. package 114. The assembly is self-correcting in that the spring force of clamp 100 will force the heat sink into a stable position if the heat sink is slightly displaced.

Figure 6:
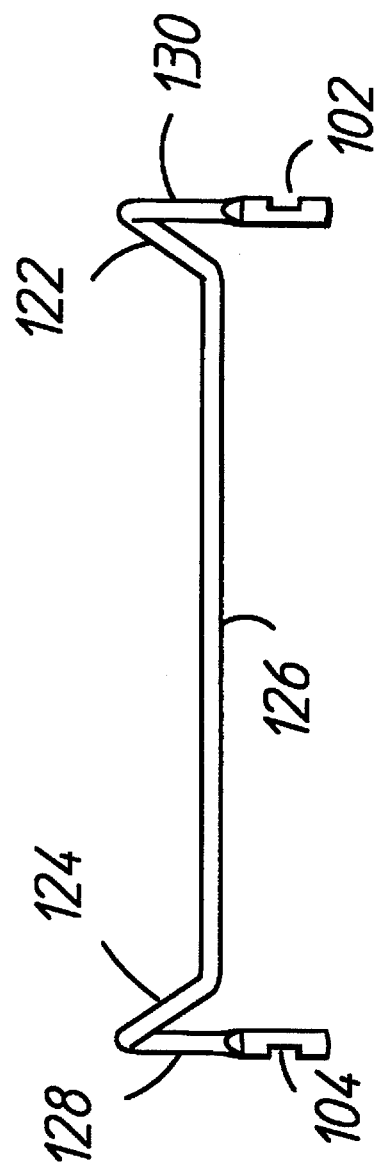
FIG. 6 is a side view of the heat sink mounting clamp according to the present invention.
Figure 7:
FIG. 7 is a side view of a notched foot of the heat sink mounting clamp according to the present invention.

FIG. 6 shows a side view of heat sink mounting clamp 100 which shows central beam 126, legs 122 and 124, feet 128 and 130 and notches 102 and 104. Feet 128 and 130 are bent approximately 90 degrees from legs 124 and 130. FIG. 7 shows a blown-up view of notch 102, which is C-shaped. Notches 102 and 104 could be L-shaped or other wise hooked at the end to lock with the edges of holes 110 and 112.

The foregoing description of the present invention has been presented for purposes of illustration and description. It is not intended to be exhaustive or to limit the invention to the precise form disclosed, and other modifications and variations may be possible in light of the above teachings. For example, the holes in the printed circuit board could be round, square, C-shaped, etc. Also, instead of securing the heat sink to a printed circuit board, a frame could be placed under the integrated circuit package that the heat sink clamp attaches to, or the heat sink clamp could lock to an edge of the integrated circuit package. Although this invention was illustrated with a pin grid array I.C. package, any I.C. package will work with the invention as long as there is a surface on the package for a heat sink. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A heat sink assembly for dissipating heat from an integrated circuit inside a rectangular package that has four corners, a top surface and a bottom surface, said heat sink assembly comprising:

a printed circuit board, said bottom surface of said integrated circuit package being mounted on said printed circuit board;

two holes in said printed circuit board, said two holes being located in said printed circuit board just outside two opposing corners of said integrated circuit package;

a heat sink having a first surface and a second surface, said first surface of said heat sink being mounted on said top surface of said integrated circuit package, said second surface of said heat sink having fins extending across said second surface, said second surface having at least one groove integral with said heat sink and extending across said second surface of said heat sink between said fins, said at least one groove having a first end and a second end; and a spring loaded clamp inserted in said groove in said second surface of said heat sink, said clamp having two cut-out notched feet that are locked into said two holes in said printed circuit board located at opposing corners of said integrated circuit package, said two holes in said printed circuit board being shaped in such a manner that said two cut-out notched feet of said spring loaded clamp are inserted into a wide portion of said two holes and said two cut-out notched feet of said spring loaded clamp are locked into a narrower portion of said two holes by means of the spring loading on said clamp.

2. The heat sink assembly according to claim 1 wherein said clamp is Z-shaped when viewed from a first direction with a first leg, a central member and a second leg, said first leg of said Z running from a first of said two holes in said printed circuit board to said first end of said groove in said heat sink, said central member of said Z running from said first end of said groove to said second end of said groove, said second leg of said Z running from said second end of said groove to a second of said two holes in said printed circuit board.

3. The heat sink assembly according to claim 2 wherein said clamp is M-shaped when viewed from a second direction that is perpendicular to said first direction.

4. The heat sink assembly according to claim 1 wherein said two holes in said printed circuit board are L-shaped.

5. The heat sink assembly according to claim 4 wherein said clamp is secured to said two L-shaped holes in said printed circuit board by cut out notches in the two feet of said clamp.

6. A method for attaching a heat sink to an integrated circuit package, said method comprising the following steps:

(a) mounting an integrated circuit package on a printed circuit board;

(b) mounting a heat sink having fins extending across an upper surface with a groove integral with said heat sink and extending across said upper surface between said fins on said integrated circuit package;

(c) inserting a spring loaded clamp having two cut-out notched feet into said groove in said heat sink; and (d) securing said clamp to said printed circuit board by locking said two cut-out notched feet into two holes in said printed circuit board located at opposing corners of said integrated circuit package, said two holes in said printed circuit board being shaped in such a manner that said two cut-out notched feet of said spring loaded clamp are inserted into a wide portion of said two holes and said two cut-out notched feet of said spring clamp are locked into a narrower portion of said two holes by means of the spring loading on said clamp.

* * * * *